US011222685B2

(12) United States Patent
Brandl et al.

(10) Patent No.: US 11,222,685 B2
(45) Date of Patent: Jan. 11, 2022

(54) REFRESH MANAGEMENT FOR DRAM

(71) Applicant: Advanced Micro Devices, Inc., Santa Clara, CA (US)

(72) Inventors: Kevin M. Brandl, Austin, TX (US); Kedarnath Balakrishnan, Bangalore (IN); Jing Wang, Austin, TX (US); Guanhao Shen, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/875,281

(22) Filed: May 15, 2020

(65) Prior Publication Data

US 2021/0358540 A1 Nov. 18, 2021

(51) Int. Cl.
*G06F 13/28* (2006.01)
*G11C 11/406* (2006.01)

(52) U.S. Cl.
CPC .............................. *G11C 11/40615* (2013.01)

(58) Field of Classification Search
CPC ................................................ G11C 11/40615
USPC ....................................................... 711/106
See application file for complete search history.

(56) References Cited

U.S. PATENT DOCUMENTS

| 9,293,188 | B2 | 3/2016 | Brandl |
| 1,040,333 | A1 | 9/2019 | Brandl et al. |
| 2014/0006703 | A1 | 1/2014 | Bains et al. |
| 2014/0059287 | A1 | 2/2014 | Bains et al. |
| 2014/0095780 | A1 | 4/2014 | Bains et al. |
| 2019/0228813 | A1 | 7/2019 | Nale et al. |
| 2020/0020384 | A1* | 1/2020 | Zhao ...................... G06F 13/18 |
| 2020/0111525 | A1* | 4/2020 | Cowles ............. G11C 11/40611 |

OTHER PUBLICATIONS

Jedec Standard; Low Power Double Data Rate 4 (LPDDR4); JESD209-4A—a Revision of JESD209-4, Aug. 2014; JEDEC Solid State Technology Association, 3103 North 10th Street, Suite 240 South, Arlington, VA 22201, United States; Nov. 2015; 8 pages.

* cited by examiner

*Primary Examiner* — Huan Hoang
(74) *Attorney, Agent, or Firm* — Polansky & Associates, P.L.L.C.; Paul J. Polansky; Nathan H. Calvert

(57) ABSTRACT

A memory controller interfaces with a dynamic random access memory (DRAM) over a memory channel. A refresh control circuit monitors an activate counter which counts a rolling number of activate commands sent over the memory channel to a memory region of the DRAM. In response to the activate counter being above an intermediate management threshold value, the refresh control circuit only issue a refresh management (RFM) command if there is no REF command currently held at the refresh command circuit for the memory region.

33 Claims, 5 Drawing Sheets

REFRESH MANAGEMENT FOR DRAM

BACKGROUND

Computer systems typically use inexpensive and high-density dynamic random access memory (DRAM) chips for main memory. When a particular row in a DRAM chip is activated for reading or writing, the word line associated with the row is activated, and the contents of the memory cells along the row are read into a page buffer. Subsequent read and write accesses to memory cells in the row can take place wholly within the page buffer, without accessing the row again. When a data processor later accesses another row in the same memory bank, the memory cells along the row are restored in a precharge operation before the other row can be activated.

Modern DRAM chips typically store one to eight gigabits (Gb) of data using deep sub-micron technology. Because of the high density and small feature size, rows of the memory are so physically close to other rows that the activation of a particular row can upset data stored in adjacent rows by changing the charge on the memory cell capacitors. In the past, these upsets were typically harmless because the memory cells are refreshed periodically. However, occasionally some memory access patterns cause certain rows to be activated and precharged so many times before the next refresh cycle that the memory cells in adjacent rows become corrupted and reverse logic state. After being corrupted, the original data is lost and cannot be restored in subsequent refresh cycles. As feature sizes become smaller, this problem, known as "row hammer", becomes harder to mitigate because the number of row activates required to cause the problem becomes smaller.

One known technique to address the data upset problem is known as targeted row refresh (TRR). In order to ensure that a DRAM row is not activated too many times within a refresh period, a memory controller places the DRAM into a TRR mode by setting certain mode register bits. In the TRR mode, successive activate and precharge commands are sent to the target row as well as the two physically adjacent rows. Once TRR mode is enabled, no other mode register commands are allowed until the TRR mode is completed. TRR mode is self-clearing and the mode register bit is set after the completion of TRR mode. While TRR allows the memory controller to avoid excessive activates to a certain row within a certain time period, it is entered by setting the mode register, which requires a substantial amount of time since all banks must be in the idle state before the controller can issue a Mode Register Set command.

Figure 1:
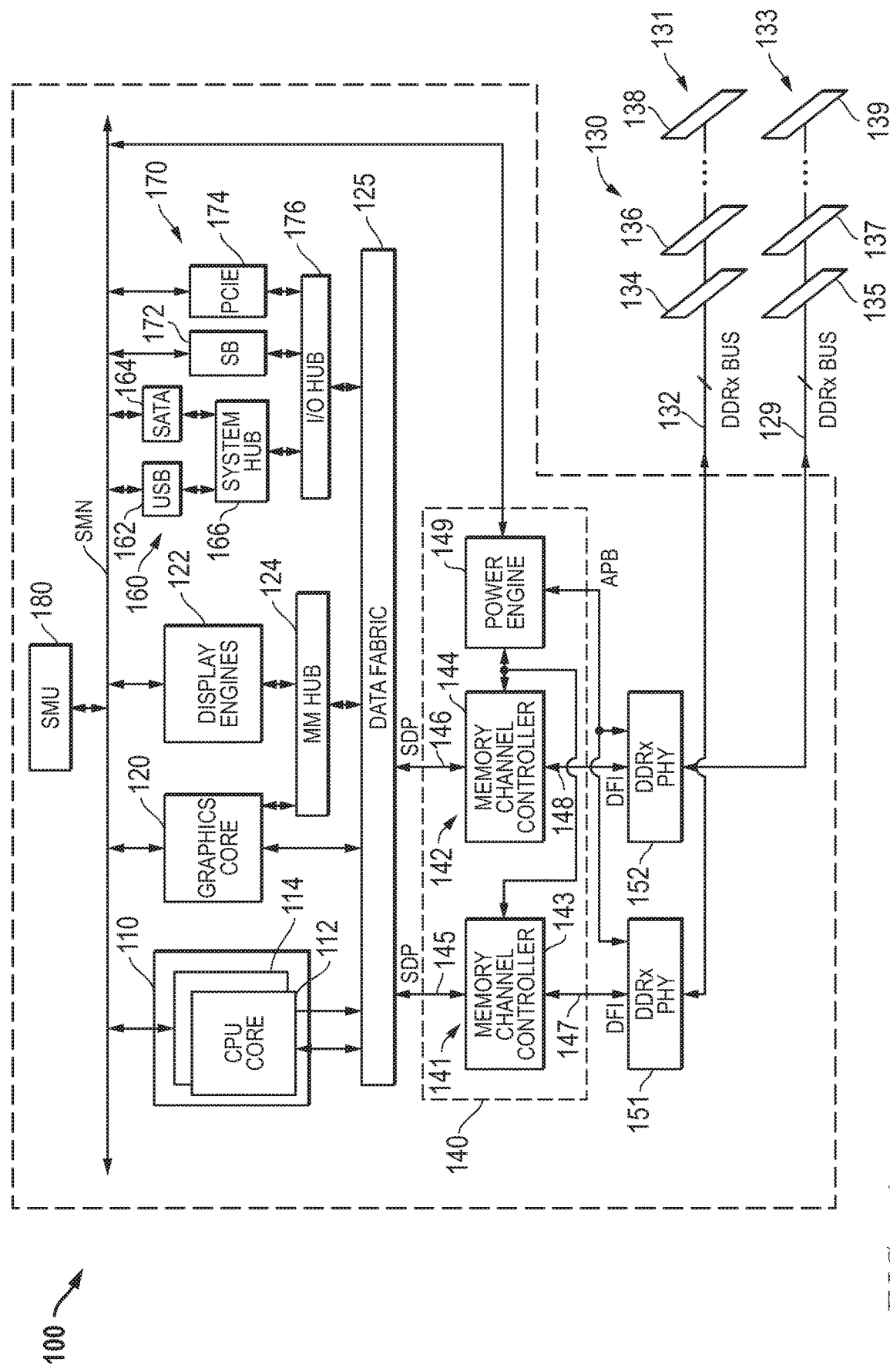
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a command queue having a first input for receiving memory access requests, and a memory interface queue having an output for coupling to a memory channel adapted for connecting to at least one dynamic random access memory (DRAM) module. The memory controller includes a refresh control circuit that monitors an activate counter which counts a rolling number of activate commands sent over the memory channel to a memory region of the DRAM module. In response to the activate counter being above an intermediate management threshold value, the refresh control circuit only issues a refresh management (RFM) command if there is no REF command currently held at the refresh command circuit for the memory region.

A method includes receiving a plurality of memory access requests including memory reads and memory writes. Memory access commands for fulfilling the memory access requests are selectively placed in a memory interface queue and transmitted from the memory interface queue to a memory channel coupled to at least one dynamic random access memory (DRAM). At an activate counter, the method counts a rolling number of activate commands sent over the memory channel to a memory region. In response to the activate counter being above an intermediate management threshold value and at or below a maximum management threshold value, the method only issues a refresh management (RFM) command if there is no REF command currently held at the refresh command circuit for the memory region.

A data processing system includes a data processor, a data fabric coupled to the central processing unit, and a memory controller coupled to the data fabric for fulfilling memory requests from the central processing unit. The memory controller includes a command queue, a memory interface queue, an arbiter, and a refresh control circuit. The command queue has a first input for receiving memory access requests. The memory interface queue has an output for coupling to a memory channel adapted for coupling to at least one dynamic random access memory (DRAM) module. The arbiter is connected to the command queue for selecting entries from the command queue, and placing them in the memory interface queue causing them to be transmitted over the memory channel. The refresh control circuit is connected to the arbiter and operates to monitor an activate counter which counts a rolling number of activate commands sent over the memory channel to a memory region. In response to the activate counter being above an intermediate management threshold value, the refresh control circuit only issue a refresh management (RFM) command if there is no REF command currently held at the refresh command circuit for the memory region.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 124, a data fabric 125, a set of peripheral controllers 160, a set of peripheral bus controllers 170, and a system management unit (SMU) 180.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 124 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
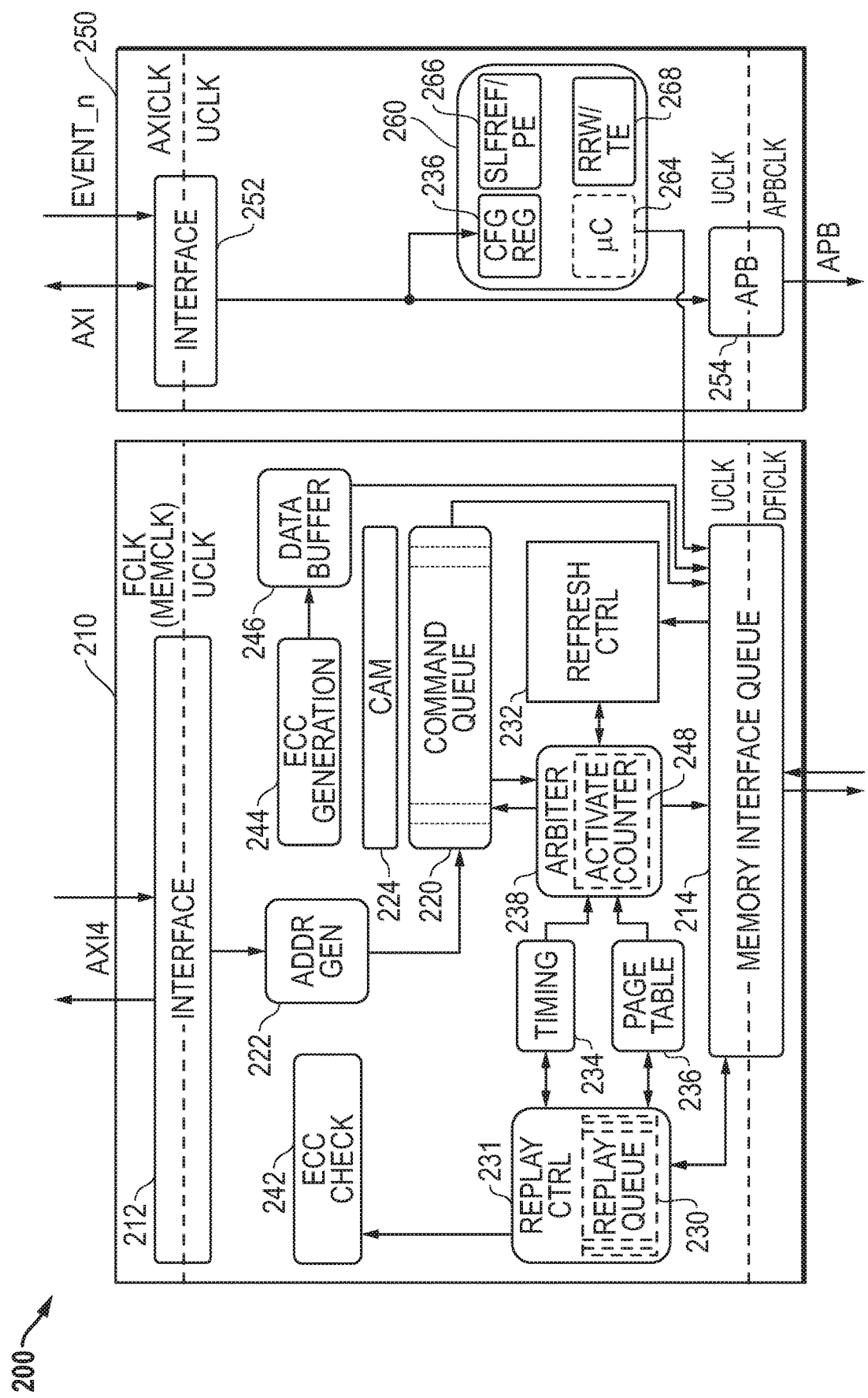
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, a refresh logic block 232, a timing block 234, a page table 236, an arbiter 238, an error correction code (ECC) check circuit 242, an ECC generation block 244, and a data buffer 246.

Interface 212 has a first bidirectional connection to data fabric 125 over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the memory. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a recovery sequence in which accesses are replayed in the case of a parity or ECC error of one of these cycles. Replayed commands are placed in the memory interface queue 214.

Refresh control logic 232 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh control logic 232 generates refresh commands periodically and in response to designated conditions to prevent data errors caused by the leaking of charge off storage capacitors of memory cells in DRAM chips. The memory regions are memory banks in some embodiments, and memory sub-banks in other embodiments as further discussed below. Refresh control logic 232 also generates refresh commands, which include both refresh (REF) commands and refresh management (RFM) commands, in which the RFM commands direct the memory to perform refresh functions for mitigating row hammer issues as further described below. In addition, refresh control logic 232 periodically calibrates ZQ to prevent mismatch in on-die termination resistance due to thermal changes in the system.

Arbiter 238 is bidirectionally connected to command queue 220 and is the heart of memory channel controller 210. Arbiter 238 improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230. Arbiter 238 includes an activate counter 248, which in this embodiment includes a counter for each memory region which counts a rolling number of activate commands sent over the memory channel to a memory region. To provide a rolling count, each activate command is counted, but the counter is reduced as described below when refresh commands or refresh management commands are issued for the memory region. Arbiter 238 is bidirectionally connected to refresh control logic 232 to monitor refresh commands and direct refresh activities.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface, version one (AXI), an advanced peripheral bus (APB) interface 254, and a power engine 260. Interface 252 has a first bidirectional connection to the SMN, which includes an input for receiving an event signal labeled "EVENT_n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (μC) 264, a self refresh controller (SLFREF/PE) 266, and a reliable read/write timing engine (RRW/TE) 268. Configuration registers 262 are programmed over the AXI bus, and store configuration information to control the operation of various blocks in memory controller 200. Accordingly, configuration registers 262 have outputs connected to these blocks that are not shown in detail in FIG. 2. Self refresh controller 266 is an engine that allows the manual generation of refreshes in addition to the automatic generation of refreshes by refresh control logic 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Figure 3:
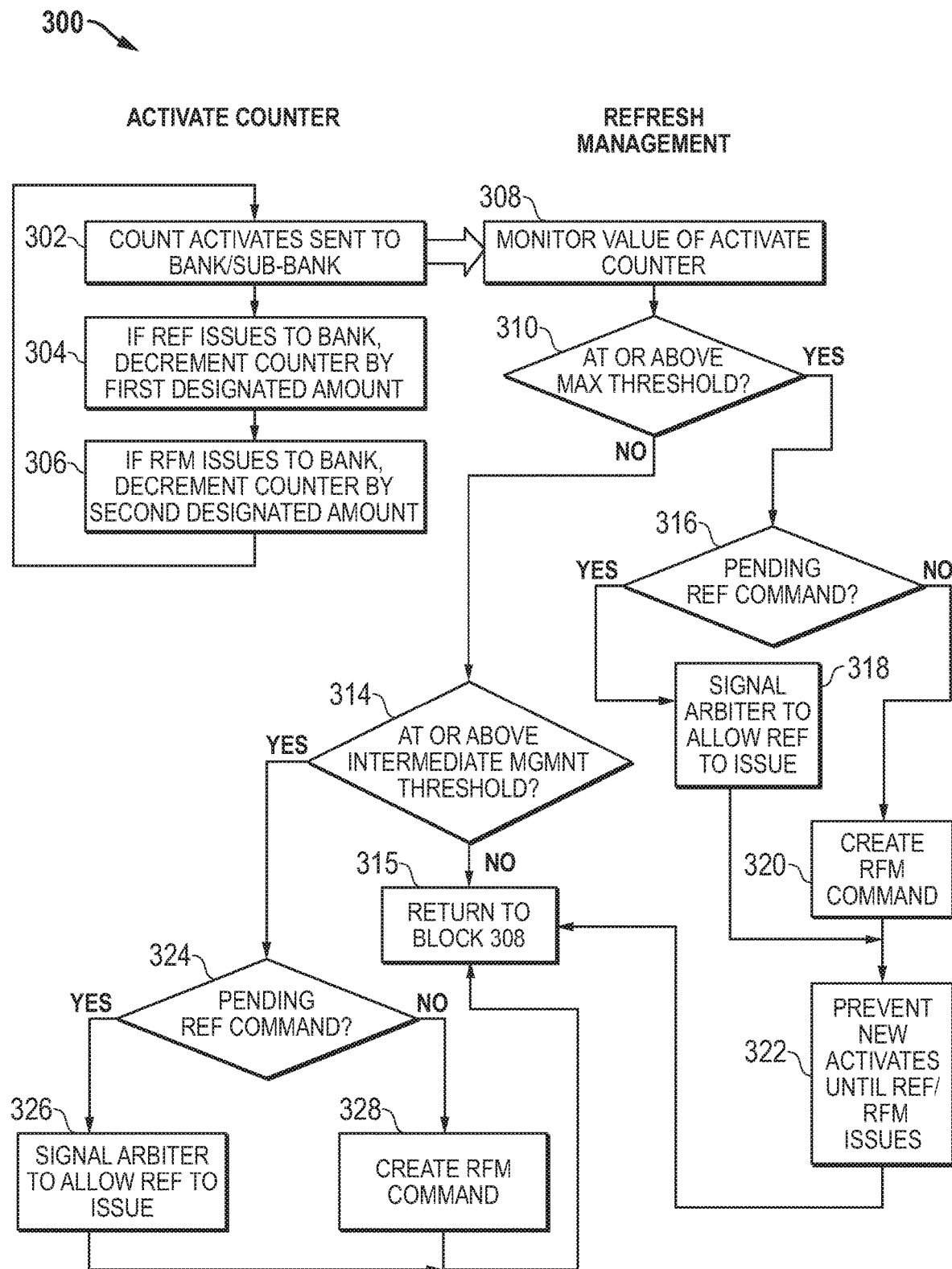
FIG. 3 is a flow diagram of a process for handling refresh management according to some embodiments.

FIG. 3 is a flow diagram of a process 300 for handling refresh management according to some embodiments. Process 300 is performed by refresh control logic 232 (FIG. 2) in some embodiments, and or by memory controller digital logic or a controller having similar functionality in other embodiments. In this embodiment, refresh control logic 232 is connected to arbiter 238 and operates to monitor an activate counter 248, which counts a rolling number of activate commands sent over the memory channel to a memory region as shown at block 302. The memory regions are memory banks in some embodiments, but are memory sub-banks in other embodiments as further discussed below. Process 300 is repeated for each memory region. At block 304, process 300 manages the counter by decrementing the counter by a first designated amount if a refresh (REF) command issues to the respective monitored region. Block 304 accounts for "per bank" REF commands which are directed to particular memory banks, and "all bank" REF commands which are directed to all the banks in a particular memory rank. For example, an activate counter for a memory bank is decremented by 50 in response to an REF command being issued to the memory bank in one embodiment, whether it is a per bank REF or an all bank REF. As such, an all bank REF command causes multiple activate counters to be decremented, for all the affected banks. Process 300 also accounts for issuance of refresh management (RFM) commands by decrementing the counter by a second designated amount when an RFM command issues to the memory region, as shown at block 306. For example, the activate counter for a memory banks is decremented by 100 in response to an RFM command issuing to the memory bank in one embodiment.

While activate counter 248 is updated by blocks 302, 304, and 306, the value is monitored by process 300 as shown at blocks 308-320, which take various refresh management actions in addition to the normal REF commands which issue to the memory region. Generally, process 300 works to provide a refresh command of some type (REF or RFM), while preferring REF commands created by periodic refresh functions of refresh control logic 232 (FIG. 2). This preference is accomplished by, in response to the activate counter being above an intermediate management threshold value and below a maximum management threshold value, determining if a pending refresh (REF) command is currently held at the refresh control circuit for the memory region and, if not, causing a refresh management (RFM) command to be sent to the memory region. If so, the pending REF command is allowed to issue with no RFM command being issued. In response to the activate counter being at or above the maximum management threshold, the process causes an RFM command to be scheduled for the memory region, and prevents any new activate commands from being scheduled to the memory region until the RFM command is scheduled or a pending REF command is scheduled. Different logical processes are used to accomplish this in different embodiments.

In the depicted process 300, block 308 monitors the value of activate counter 248. If the value is at or above a maximum management threshold at block 310, process 300 goes to block 316 where it checks if an REF command is pending at arbiter 238 for the memory region. Block 316 checks for "per bank" REF commands and "all bank" REF commands that apply to the bank in question. If one of either type REF commands is pending which covers the bank in question, the process goes to block 318 where it signals the arbiter to prioritize the pending REF command to require it to be scheduled and issued. If no pending REF command is found at block 316, process 300 goes to block 320, where it creates a new RFM command to be scheduled by the arbiter. After either of blocks 318 or 320, process 300 goes to block 322 where it prevents any activate commands being scheduled at arbiter 238 until either the newly-created RFM command is scheduled or a pending REF is scheduled. In some alternative embodiments, the refresh control circuit is further operable to, in response to a designated condition of activate counter 248 such as crossing the maximum threshold at block 310, cause a refresh rate to double for the memory region until the designated condition is remedied. Such a rate increase may be performed in addition to or instead of creating an RFM command at block 320. In some embodiments, the refresh control logic is configurable to include the rate increase.

If activate counter 248 is not above the maximum management threshold at block 310, block 314 checks if activate counter 248 is at or above the intermediate management threshold. If not, block 315 simply returns to block 308 to continue monitoring the activate counter. If so, process 300 goes to block 324 where it checks if an REF command is pending at arbiter 238 for the memory region. Block 316 checks for "per bank" REF commands and "all bank" REF commands that apply to the bank in question. If one of either type REF commands is pending which covers the bank in question, the process goes to block 326 where it signals the arbiter to prioritize the pending REF command to require it to be scheduled and issued. If not, process 300 goes to block 328, where it creates a new RFM command to be scheduled by the arbiter.

While the depicted process blocks are shown in order, this order is not limiting, and the depicted logical functionality, or its logical equivalent, is typically accomplished by various digital logic circuits operating in parallel. In various embodiments, digital logic circuits perform the activate counter monitoring in various ways, such as by responding to changes in the activate counter or repeatedly comparing the activate counter value to one or both of the intermediate threshold value and the maximum threshold value. The monitoring at block 308 continues after each depicted branch of logical functionality is finished.

The intermediate management threshold and the maximum management threshold are preferably adjustable to allow the memory controller to work well with different DRAM modules from various manufacturers, for which REF and RFM commands often vary in their implementation. In some embodiments, the intermediate management threshold and the maximum management threshold are allowed to be set to the same value to implement a simplified version of the monitoring process. Setting these two threshold values to be equal preferably functions to disable the maximum management threshold logic (block 310), and allow the logic implementing the intermediate management threshold comparison (blocks 314, 315, 324, 326, and 328) to handle situations in which the counter exceeds the equal threshold values. Such implementations thereby function to prefer pending REF commands when they exist rather than creating new RFM commands. This preference often improves efficiency because REF commands are often faster than RFM commands among various DRAM module implementations. In other implementations, only the intermediate management threshold is used.

In various embodiments, the memory region for which an activate counter is monitored is a memory bank or a sub-bank. When the memory region is a sub-bank of a memory bank, and the refresh control circuit is operable to monitor multiple activate counters for respective multiple sub-banks of the memory bank and apply REF and RFM commands at the bank level. Such commands cause an update of all the sub-bank activate counters for sub-banks within the bank. Similarly, all bank REF commands cause an update of sub-bank activate counters for all sub-banks within the respective rank. As such, process 300 is operable to monitor the activate counters at a granularity level of the multiple sub-banks, and allow or cause the REF and RFM commands to issue at a granularity level of the selected memory bank. The refresh control circuit may be configurable to provide activate counters for memory banks or sub-banks, with the refresh management process also adjustable to account for banks or sub-banks.

Figure 4:
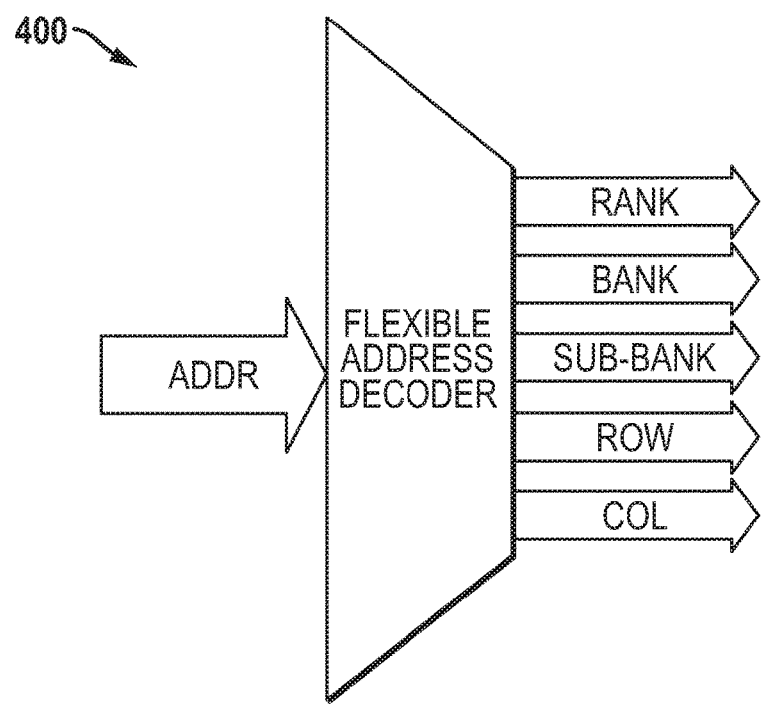
FIG. 4 illustrates in block diagram form a flexible address decoder according to some embodiments.

FIG. 4 illustrates in block diagram form a flexible address decoder 400 according to some embodiments. Flexible address decoder 400 is included in address generator 222 (FIG. 2) for some embodiments in order to spread consecutive memory addresses across the multiple sub-banks and provide memory address bits for addressing the multiple sub-banks. Flexible address decoder 400 receives an incoming logical address ADDR associated with the memory command being decoded, and applies a hash function or other suitable mathematical spreading function which maps the address to a physical memory location in the respective DRAM module by mapping the incoming logical address bits to outgoing physical address bits in the DRAM module. As depicted, in this version the outgoing address bits include one or more RANK bits selecting a memory rank, one or more BANK bits selecting a memory bank, one or more SUB-BANK bits selecting a sub-bank, one or more ROW bits selecting a row, and one or more COL bits selecting a column.

Figure 5:
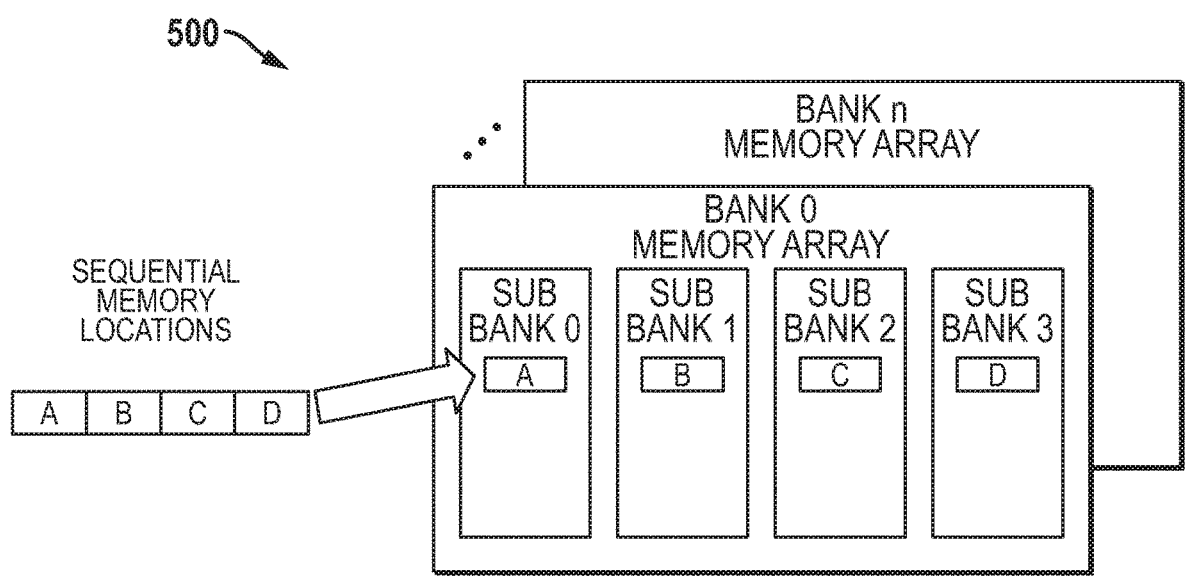
FIG. 5 illustrates in diagram form a process of mapping logical memory addresses to physical memory locations using a flexible address decoder such as that of FIG. 4.

FIG. 5 illustrates in diagram form a process 500 of mapping logical memory addresses to physical memory locations using a flexible address decoder such as that of FIG. 4. Process 500 helps to mitigate "row hammer" issues by spreading consecutive logical addresses to rows across different sub-banks within a memory bank. As depicted, a memory rank of the DRAM module includes a number of memory banks, BANK 0 through BANK n. In this embodiment, four sub-banks are used within each bank of the DRAM module, SUB-BANK 0, SUB-BANK 1, SUB-BANK 2, and SUB-BANK 3. In other embodiments, two sub-banks may be used, or more than four sub-banks may be used. A range of sequential logical memory locations A through D are depicted, which are shown by the arrow as being mapped according to flexible address decoding to different sub-banks within a bank. The refresh management techniques described herein are used, in some embodiments, in combination with an address mapping process like that of FIG. 5, providing activate counters for each sub-bank rather than at the memory bank level.

Figure 6:
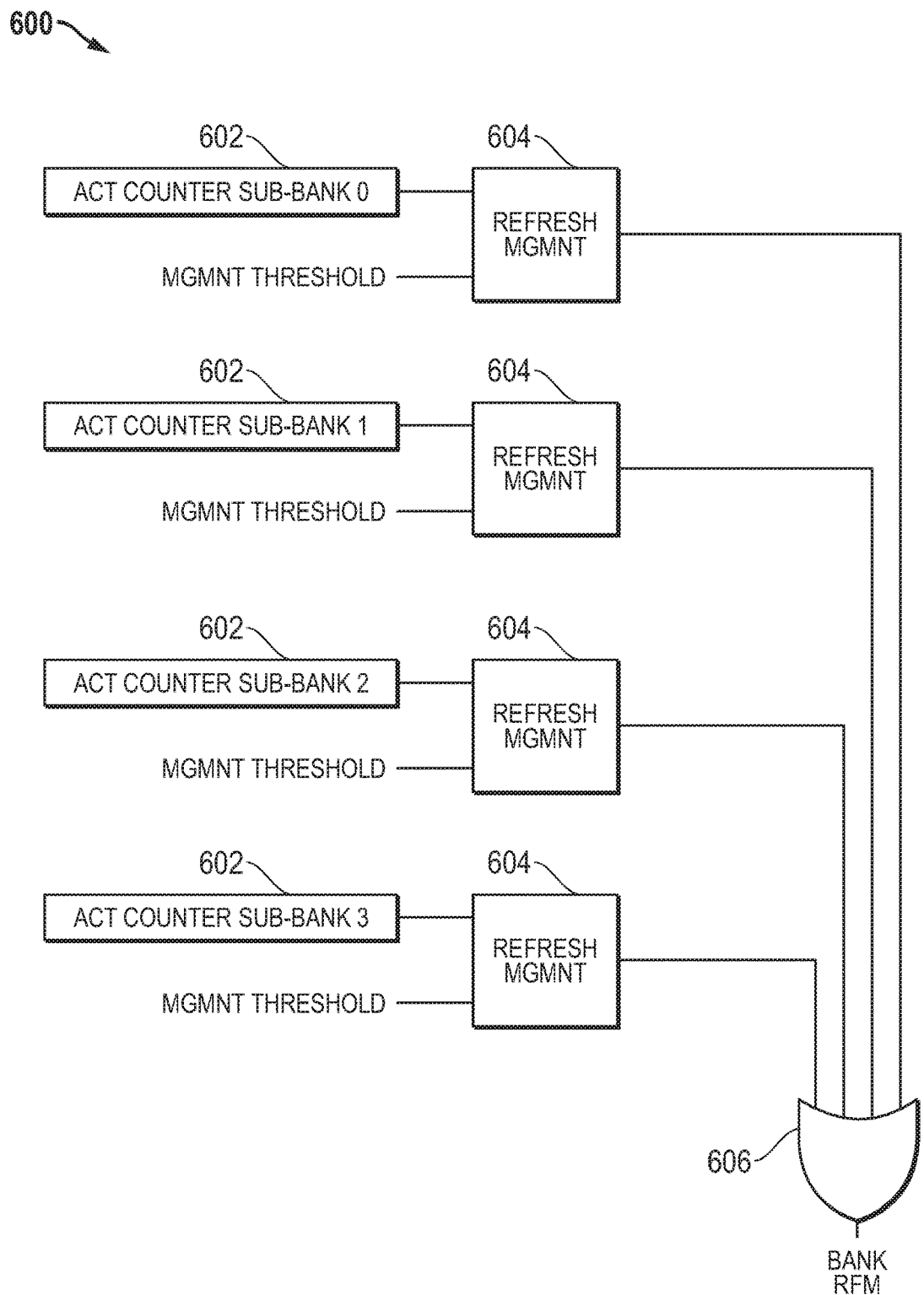
FIG. 6 illustrates in diagram form a circuit for performing refresh management of memory sub banks according to some embodiments.

FIG. 6 illustrates in block diagram form a circuit 600 for performing refresh management of memory sub banks according to some embodiments. Circuit 600 implements the refresh management techniques discussed above with respect to FIG. 3, and provides activate counting at a sub-bank level of granularity. In this example embodiment, the memory bank for which refresh management is conducted includes four sub-banks. Activate (ACT) commands for each sub-bank, SUB-BANK 0 through SUB-BANK 3, are tracked with a respective activate counter 602 for each sub-bank as depicted. A refresh management circuit 604 is provided for each sub-bank to perform the refresh management process such as the process of FIG. 3. While in this embodiment a separate refresh management circuit 604 is provided for each sub bank, in other embodiments a single refresh management circuit may manage all of the sub-banks by cycling through them to check the relevant conditions.

Each refresh management circuit 604 has an input for the respective activate counter 602 value, and additional inputs for adjustable configuration values such as the depicted management threshold input "MGMNT THRESHOLD", through which adjustable values such as the intermediate management threshold and the maximum management threshold are provided. The outputs of the four refresh management circuit 604 signal whether an RFM commands should issue for the respective sub-bank according to the refresh management process employed, such as, for example, the process of FIG. 3. These four outputs are fed to a four-input OR gate 606, which produces an output "BANK RFM" indicating a RFM command should be issued for the memory bank being monitored. Circuit 600 thereby provides refresh management at the sub-bank granularity level, but activates RFM commands at the granularity level of a memory bank.

Memory controller 200 of FIG. 2 or any portions thereof, such as arbiter 238 and refresh control circuit 232, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory channel controller 210 and/or power engine 250 may vary in different embodiments. Memory controller 200 may interface to other types of memory besides DDRx, such as high bandwidth memory (HBM), RAMbus DRAM (RDRAM), and the like. While the illustrated embodiment showed each rank of memory corresponding to separate DIMMs or SIMMs, in other embodiments each module can support multiple ranks. Still other embodiments may include other types of DRAM modules or DRAMs not contained in a particular module, such as DRAMs mounted to the host motherboard. Accordingly, it is intended by the appended claims to cover all modifications of the disclosed embodiments that fall within the scope of the disclosed embodiments.

What is claimed is:

1. An apparatus comprising:
   a memory controller, comprising:
   a command queue having a first input for receiving memory access requests;
   a memory interface queue having an output for coupling to a memory channel adapted for coupling to at least one dynamic random access memory (DRAM);
   an arbiter coupled to the command queue for selecting entries from the command queue, and placing them in the memory interface queue causing them to be transmitted over the memory channel; and
   a refresh control circuit coupled to the arbiter and operable to:
   monitor an activate counter which counts a number of activate commands sent over the memory channel to a memory region; and
   in response to the activate counter being above an intermediate management threshold value and at or below a maximum management threshold value, only issue a refresh management (RFM) command if there is no refresh (REF) command currently held at the refresh control circuit for the memory region.

2. The memory controller of claim 1, wherein the refresh control circuit is operable to, in response to the activate counter being above the maximum management threshold, determine if a REF command is currently held at the refresh control circuit for the memory region and, if not, cause a RFM command to be sent to the memory region, and if so, allow the pending REF command to issue with no RFM command being issued, and prevent any new activate commands from being scheduled to the memory region until one of the RFM command or the pending REF command is scheduled.

3. The memory controller of claim 1, wherein the arbiter determines eligibility for command selection based at least on respective activate counter values for memory regions of the respective commands.

4. The memory controller of claim 1, wherein memory region is one of a memory bank or a sub-bank.

5. The memory controller of claim 4, wherein the memory region is a sub-bank of a memory bank, and wherein the refresh control circuit is operable to monitor multiple activate counters for respective multiple sub-banks of the memory bank.

6. The memory controller of claim 5, wherein the refresh control circuit is operable to account for REF and RFM commands directed to the memory bank by causing the activate counters to be decremented.

7. The memory controller of claim 5, wherein the refresh control circuit is operable to monitor the activate counters at a granularity level of the multiple sub-banks, and allow or cause the REF and RFM commands to issue at a granularity level of the memory bank.

8. The memory controller of claim 5, further comprising flexible address decoder logic operable to spread consecutive memory addresses across the multiple sub-banks and provide memory address bits for addressing the multiple sub-banks.

9. The memory controller of claim 4, wherein the refresh control circuit is configurable to provide activate counters for memory banks or sub-banks.

10. The memory controller of claim 1, wherein the refresh control circuit is further operable to, in response to a designated condition of the activate counter, cause a refresh rate to double for the memory region until the designated condition is remedied.

11. The apparatus of claim 1 further comprising:
   one or more processor cores in communication with the memory controller; and
   one or more memory devices in communication with the memory controller and comprising said memory region and wherein the one or more memory devices receive the RFM command issued by the memory controller.

12. A method, comprising:
   receiving a plurality of memory access requests including memory reads and memory writes;
   selectively placing memory access commands for fulfilling the memory access requests in a memory interface queue and transmitting the memory access commands from the memory interface queue to a memory channel coupled to at least one dynamic random access memory (DRAM);

counting, at an activate counter, a number of activate commands sent over the memory channel to a memory region;

in response to the activate counter being above a management threshold value and at or below a maximum management threshold value, only issuing a refresh management (RFM) command if there is no refresh (REF) command currently held at a refresh control circuit for the memory region.

13. The method of claim 12, further comprising, in response to the number of activate commands being above the maximum management threshold, causing an RFM command to be sent to the memory region.

14. The method of claim 12, further comprising, in response to the activate counter being above the maximum management threshold, determining if a REF command is currently held at the refresh control circuit for the memory region and, if not, causing a RFM command to be sent to the memory region, and if so, allowing the pending REF command to issue with no RFM command being issued, and preventing any new activate commands from being scheduled to the memory region until one of the RFM command or the pending REF command is scheduled.

15. The method of claim 12, further comprising, at a command arbiter, determining eligibility for command selection based on at least on respective activate counter values for memory regions of the respective commands.

16. The method of claim 12, wherein the memory region is one of a memory bank or a sub-bank.

17. The method of claim 16, wherein when the memory region is a memory sub-bank of a memory bank, the method further comprises monitoring multiple activate counters for respective multiple sub-banks of the memory bank.

18. The method of claim 17, further comprising accounting for REF and RFM commands directed to the memory bank by causing the multiple counters to be decremented.

19. The method of claim 17, further comprising monitoring the activate counters at a granularity level of the multiple sub-banks, and issuing the REF and RFM commands at a granularity level of the memory bank.

20. The method of claim 17, further comprising spreading consecutive memory addresses across the multiple sub-banks.

21. The method of claim 20, wherein spreading the consecutive memory addresses is performed at a flexible address decoder which provides memory address bits for addressing the multiple sub-banks.

22. The method of claim 16, wherein the refresh control circuit is configurable to provide activate counters for memory banks or sub-banks.

23. The method of claim 12, further comprising, in response to a designated condition of the activate counter, cause a refresh rate to double for the memory region until the designated condition is remedied.

24. A data processing system, comprising:
a data processor;
a data fabric coupled to the data processor, and
a memory controller coupled to the data fabric for fulfilling memory requests from the data processor, the memory controller comprising:
a command queue having a first input for receiving memory access requests;
a memory interface queue having an output for coupling to a memory channel adapted for coupling to at least one dynamic random access memory (DRAM);
an arbiter coupled to the command queue for selecting entries from the command queue, and placing them in the memory interface queue causing them to be transmitted over the memory channel; and
a refresh control circuit coupled to the arbiter and operable to:
monitor an activate counter which counts a rolling number of activate commands sent over the memory channel to a memory region; and
in response to the activate counter being above an intermediate management threshold value and at or below a maximum management threshold value, only issue a refresh management (RFM) command if there is no refresh (REF) command currently held at the refresh command circuit for the memory region.

25. The data processing system of claim 24, wherein the refresh control circuit is operable to, in response to the activate counter being above the maximum management threshold, determine if a REF command is currently held at the refresh control circuit for the memory region and, if not, cause a RFM command to be sent to the memory region, and if so, allow the pending REF command to issue with no RFM command being issued, and prevent any new activate commands from being scheduled to the memory region until one of the RFM command or the pending REF command is scheduled.

26. The data processing system of claim 24, wherein the arbiter determines eligibility for command selection based on at least on respective activate counter values for memory regions of the respective commands.

27. The data processing system of claim 24, wherein the memory region is one of a memory bank or a sub-bank.

28. The data processing system of claim 27, wherein the memory region is a sub-bank of a memory bank, and wherein the refresh control circuit is operable to monitor multiple activate counters for respective multiple sub-banks of the memory bank.

29. The data processing system of claim 28, wherein the refresh control circuit is operable to account for REF and RFM commands directed to the memory bank by causing the activate counters to be decremented.

30. The data processing system of claim 28, wherein the refresh control circuit is operable to monitor the activate counters at a granularity level of the multiple sub-banks, and allow or cause the REF and RFM commands to issue at a granularity level of the memory bank.

31. The data processing system of claim 28, further comprising flexible address decoder logic operable to spread consecutive memory addresses across the multiple sub-banks and provide memory address bits for addressing the multiple sub-banks.

32. The data processing system of claim 28, wherein the refresh control circuit is configurable to provide activate counters for memory banks or sub-banks.

33. The data processing system of claim 24, wherein the refresh control circuit is further operable to, in response to a designated condition of the activate counter, cause a refresh rate to double for the memory region until the designated condition is remedied.

* * * * *